(12) United States Patent
Aikawa et al.

(10) Patent No.: US 6,753,817 B2
(45) Date of Patent: Jun. 22, 2004

(54) MULTI-ELEMENT PLANAR ARRAY ANTENNA

(75) Inventors: Masayoshi Aikawa, Kanagawa (JP); Eisuke Nishiyama, Saga (JP); Fumio Asamura, Saitama (JP); Takeo Oita, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 10/328,289

(22) Filed: Dec. 23, 2002

(65) Prior Publication Data

US 2003/0122715 A1 Jul. 3, 2003

(51) Int. Cl.[7] .......................... H01Q 1/38; H01Q 21/24
(52) U.S. Cl. ................ 343/700 MS; 343/846
(58) Field of Search .................. 343/700 MS, 768, 343/770, 846, 767, 853, 702, 754, 848, 830, 797, 795

(56) References Cited

U.S. PATENT DOCUMENTS

| | | | | |
|---|---|---|---|---|
| 4,929,959 A | * | 5/1990 | Sorbello et al. ...... | 343/700 MS |
| 5,001,493 A | * | 3/1991 | Patin et al. .......... | 343/700 MS |
| 5,381,157 A | * | 1/1995 | Shiga .................. | 343/700 MS |
| 5,510,803 A | * | 4/1996 | Ishizaka et al. ...... | 343/700 MS |
| 5,691,734 A | * | 11/1997 | Davies ................ | 343/795 |
| 6,114,998 A | * | 9/2000 | Schefte et al. ....... | 343/700 MS |
| 6,239,762 B1 | * | 5/2001 | Lier .................... | 343/770 |
| 6,531,984 B1 | * | 3/2003 | Johannisson et al. | 343/700 MS |

* cited by examiner

*Primary Examiner*—Don Wong
*Assistant Examiner*—Chuc Tran
(74) *Attorney, Agent, or Firm*—Katten Muchin Zavis Rosenman

(57) ABSTRACT

A multi-element planar array antenna has a ground conductor formed on a first principal surface of the substrate, a first and a second slot line formed in the ground conductor and intersecting each other, a first and a second microstrip line formed on a second principal surface of the substrate, and traversing the first slot line respectively at positions corresponding to both end sides of the first slot line, a third and a fourth microstrip line formed on the second principal surface, and traversing the second slot line respectively at positions corresponding to both end sides of the second slot line, and four antenna elements of microstrip line type formed respectively in intersection regions between both end sides of the first and second microstrip lines and both end sides of the third and fourth microstrip lines, respectively, on the second principal surface.

19 Claims, 12 Drawing Sheets

MULTI-ELEMENT PLANAR ARRAY ANTENNA

BACKGROUND OF THE INVENTION

1. Field of the Invention

The present invention relates to a multi-element planar array antenna which comprises a plurality of antenna elements arranged on a two-dimensional plane, and more particularly, to a multi-element planar array antenna which improves the polarization characteristics to facilitate the utilization of polarization components, and can be readily reconfigured into an active antenna by mounting a semiconductor device, IC (integrated) and the like thereon.

2. Description of the Related Arts

Planar antennas are widely used in for example, radio communications and satellite broadcasting in a microwave band and a millimeter band. Planar antennas are classified into a microstrip line type, a slot line type, and the like. Generally, the microstrip line planar antenna is often used because of a simple structure in a feed system, better radiation characteristics, and the like.

In recent years, a so-called multi-element array structure using a plurality of antenna elements has been employed with the intention of improving the antenna gains which is a challenge for the microstrip line planar antenna. As is well known, electromagnetic radiations include polarization components such as horizontal and vertical linear polarizations, and right-handed and left-handed circular polarizations. Many antennas making use of such polarization characteristics are widely used with the intention of sharing an antenna for transmission and reception, effectively utilizing the frequency resources, suppressing interference between transmission and reception, and the like.

FIGS. 1A to 1D are plan views respectively illustrating exemplary configurations of conventional planar antennas. Out of these planar antennas, those illustrated in FIGS. 1A, 1B and 1C are microstrip line planar antennas, while that illustrated in FIG. 1C is a slot line planar antenna. Each of these figures illustrates an exemplary configuration of a planar antenna having single antenna element 1 for producing a linear or a circular polarization.

The planar antenna illustrated in FIG. 1A is a microstrip line planar antenna for linear polarization which comprises square antenna element (i.e., circuit conductor) 1 and feed line 2 on one principal surface of substrate 3 made, for example, of a dielectric material. A ground conductor is disposed substantially over the entirety of the other principal surface of substrate 3. In this planar antenna, the antenna frequency (i.e., resonant frequency) is determined by the shape of antenna element 1, the dielectric coefficient of substrate 3, and the like. Also, in this planar antenna, a polarization plane of linear polarization for transmission and reception is set by a feeding direction in which feed line 2 is connected. Specifically, as indicated by arrows, a vertical polarization component can be transmitted and received when antenna element 1 is fed in the vertical direction (up-to-down direction in the figure), while a horizontal polarization component can be transmitted and received when antenna element 1 is fed in the horizontal direction (left-to-right direction in the figure).

The planar antenna illustrated in FIG. 1B is a microstrip line planar antenna having square antenna element 1 on one principal surface of substrate 3, similar to the one illustrated in FIG. 1A, but differs in that antenna element 1 is fed at two points so that it is adapted for use with a circular polarization. Specifically, feed line 2 is branched into two in the middle such that one of the branch lines is used as a vertical feed line while the other is used as a horizontal feed line. The vertical and horizontal feed lines differ in the electric length from each other by one-quarter wavelength. As a result, a vertical polarization component is out of phase from a horizontal polarization component by 90 degrees ($\pi/2$), so that these polarization components are combined into a circular polarization. Consequently, the resulting planar antenna is capable of transmitting and receiving a circular polarization. It should be noted that the planar antennas illustrated in FIGS. 1A and 1B each utilize a degeneration mode in antenna element 1.

The planar antenna illustrated in FIG. 1C is a microstrip line planar antenna for circular polarization, in which degeneration is released in antenna element 1 to feed antenna element 1 at one point. In this planar antenna, portions of antenna element 1 in a set of diagonal directions are cut away to release the degeneration so that resonance modes in two directions (vertical and horizontal directions) are out of phase by 90 degrees from each other at the operating frequency of the antenna, thereby providing the capabilities to transmit and receive a circular polarization.

FIG. 1D illustrates a slot line planar antenna for use with a circular polarization which releases degeneration in an antenna element. This planar antenna comprises antenna element 21 having a slot line instead of an antenna element in a microstrip line planar antenna. Antenna element 21 is rectangular in shape and released from the degeneration, thereby constituting a resonator at the antenna frequency. When antenna element 21 is fed at one corner thereof, resonance modes in the two directions are out of phase by 90 degrees from each other, similar to the foregoing, thereby providing the capabilities to transmit and receive a circular polarization.

The conventional microstrip line type and slot line type planar antennas described above can be shared for a horizontal polarization and a vertical polarization, and transmit and receive the circular polarization when they are provided with a single antenna element alone. However, these conventional planar antennas are problematic in configuring a multi-element planar array antenna comprised of a plurality of antenna elements arranged in a two-dimensional plane while maintaining the above functions of the planar antenna having a single antenna element.

Specifically, any of the planar antennas of the types illustrated in FIGS. 1A to 1D encounters difficulties, when it is configured as a multi-element array, in implementing connections of the feed line to respective antenna elements, i.e., a feeder circuit on the plane. For this reason, a multi-layer substrate, for example, should be used to implement a feeder circuit, in which case difficult designing is obliged for ensuring the same line lengths, for example, from a feed point, due to a requirement of exciting the respective antenna elements in phase.

Further, when the configuration illustrated in FIG. 1B is used for a circular polarization antenna, a phase difference feeder circuit is required for each antenna element for giving a phase difference of $\pi/2$. In addition, the planar antenna illustrated in FIG. 1C suffers from a narrow operating frequency range on principles. The planar antenna illustrated in FIG. 1D is similar in that it encounters difficulties in double use of both vertical and horizontal polarization components, and an adaptation for a two-dimensional planar array antenna using a circular polarization component.

As described above, the conventional planar antennas, whichever one is concerned, generally have a problem in the double use of polarizations, and the adaptation for a two-dimensional planar array antenna using a circular polarization component.

SUMMARY OF THE INVENTION

It is an object of the present invention to provide a multi-element planar array antenna which has a two-dimensional array structure that can use polarization components together and use a circular polarization.

The inventors diligently investigated the configuration of planar antennas, and perceived the transmission characteristics and line structures of microstrip lines and slot lines formed on both sides of a substrate made of a dielectric material or the like, and particularly perceived features of an anti-phase serial branch from the slot line to the microstrip line, and a circuit in which microstrip lines intersect each other, reaching the completion of the present invention.

Specifically, the object of the present invention is achieved by a multi-element planar array antenna which includes a substrate, a ground conductor formed on a first principal surface of the substrate, a first and a second slot line formed in the ground conductor, and intersecting each other, a first and a second microstrip line formed on a second principal surface of the substrate, and traversing the first slot line respectively at positions corresponding to both end sides of the first slot line, a third and a fourth microstrip line formed on the second principal surface, and traversing the second slot line respectively at positions corresponding to both end sides of the second slot line, and four antenna elements of a microstrip line type formed respectively in intersection regions between both end sides of the first and second microstrip lines and both end sides of the third and fourth microstrip lines, respectively, on the second principal surface. Each antenna element is arranged for excitation in two directions by connecting one of both ends of one of the first and second microstrip lines with one of both ends of one of the third and fourth microstrip lines. The two excitation directions of each antenna element are typically orthogonal to each other, and each antenna element is excited in phase.

In this multi-element planar array antenna, a feed point is typically at the intersection of the first and second slot lines. An excitation mode is selected for each antenna element by selecting at least two of four corners formed in the ground conductor at the intersection and applying a high frequency signal to the selected corners.

Specifically, in the present invention, the microstrip lines are routed on both end sides of a set of intersecting slot lines to traverse them, so that a high frequency signal in a balanced mode, propagating through the slot line, is converted to an unbalanced mode by the microstrip lines, and branched in series in opposite phase. The resulting high frequency signals propagate through the microstrip lines.

An excitation direction in each antenna element can be selected by selecting corners of the ground conductor constituting the intersection of the set of the slot lines at the position of the intersection, and applying a high frequency signal to the selected corners. For example, by selecting corners to apply a high frequency signal between ground conductors on both sides of the first slot line, the high frequency signal is converted to the unbalanced mode by the first and second microstrip lines, so that each antenna element is fed in a direction orthogonal to the direction in which the first slot line extends. Similarly, by selecting corners to apply a high frequency signal between ground conductors on both sides of the second slot line, each antenna element is fed in a direction orthogonal to the direction in which the second slot line extends. By thus selecting a feed mode at the intersection, one of the first and second slot lines can be excited, and an excitation direction can be selected for each antenna element. Thus, the multi-element planar array antenna can select one from linear polarizations in orthogonal directions as well as can use the linear polarizations together.

Further, as one pair of corners in a diagonal direction is selected from four corners at the intersection and applied with a high frequency signal, both slot lines are excited so that each antenna element is simultaneously fed from the two directions orthogonal to each other. As such, polarization components in the two directions are combined to provide a polarization component in an intermediate direction of the two directions. In addition, when the corners in the respective diagonal directions are formed in pairs, and each pair is applied with a high frequency signal at a different level, the polarization direction can be arbitrarily controlled to utilize any polarization component.

Moreover, the first and second slot lines are set such that their electric lengths differ from each other by $\pi/2$ as calculated in terms of phase difference. By applying a high frequency signal to one pair of corners in one diagonal direction at the intersection, a circular polarization can be transmitted and received. For example, a circular polarization can be generated by delaying a vertical excitation component in phase from a horizontal excitation component by $\pi/2$. In this event, electromagnetic radiations can be a right-handed circular polarization or a left-handed circular polarization depending on to which pair of corners positioned in the diagonal directions a high frequency signal is applied at the intersection. It is therefore possible to select a circular polarization, and again select a right-handed circular polarization or a left-handed circular polarization as well as to use the right-handed circular polarization together with left-handed circular polarization by simultaneously selecting the right-handed circular polarization and left-handed circular polarization, wherein, by way of example, the right-handed circular polarization component is transmitted while the left-handed circular polarization component is received, thereby readily implementing a multi-element planar array antenna capable of selecting one from orthogonal circular polarizations and using them together.

Moreover, in the present invention, a 16-element planar array antenna and planar antenna having a larger number of antenna elements can be configured by utilizing an in-phase parallel branch of slot lines from microstrip lines.

As appreciated from the foregoing, the present invention can readily implement a four-element planar array antenna which can use together linear polarizations such as a horizontal polarization component and a vertical polarization component and it can also readily implement double use of circular polarization having a right-handed polarization component and a left-handed polarization component. In addition, the present invention can readily implement multi-element planar array antenna having eight-elements, 16-elements, 64-elements and the like. The present invention can readily implement a multi-band planar array antenna by use of two frequencies.

Since the present invention utilizes the series branch from the slot lines to the microstrip lines, the antenna elements are complementary in excitation, consequently providing a planar antenna which excels in suppression of cross polarizations and circular polarization axial ratio characteristics.

Further, the planar antenna structure of the present invention facilitates mounting of a functional circuit such as a semiconductor device, an integrated circuit, an IC chip and the like for the slot lines, and therefore is effective in providing an active planar array antenna, an adaptive active planar array antenna, and a smart planar array antenna.

DETAILED DESCRIPTION OF THE INVENTION

Figure 1A:
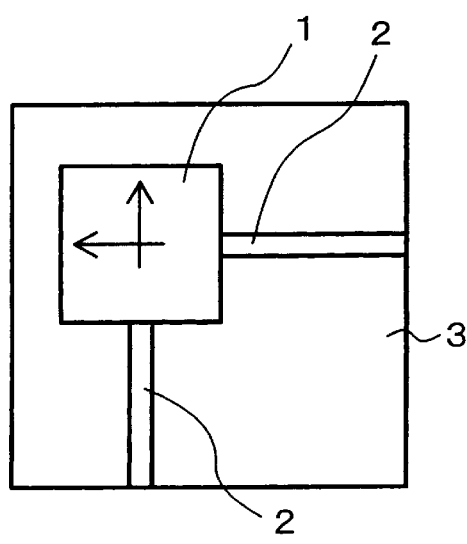
FIGS. 1A to 1D are plan views each illustrating an exemplary configuration of a conventional planar antenna.
Figure 1B:
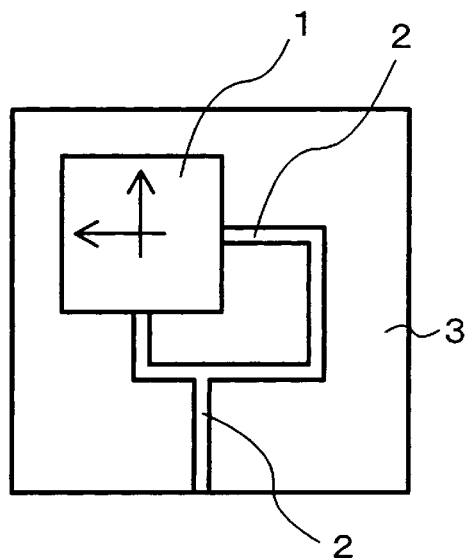
Figure 1C:
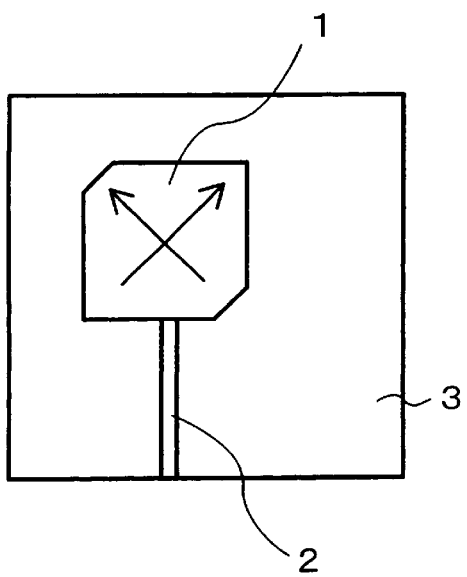
Figure 1D:
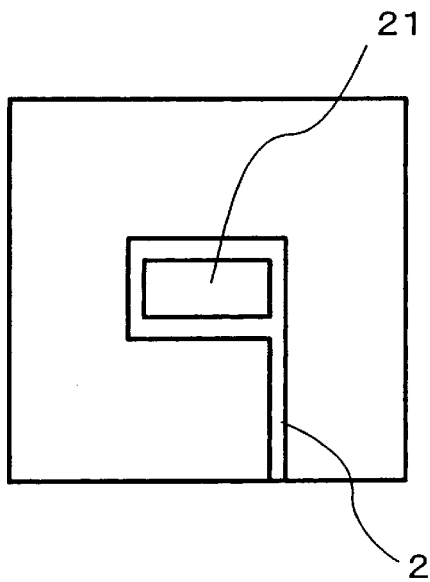
Figure 2A:
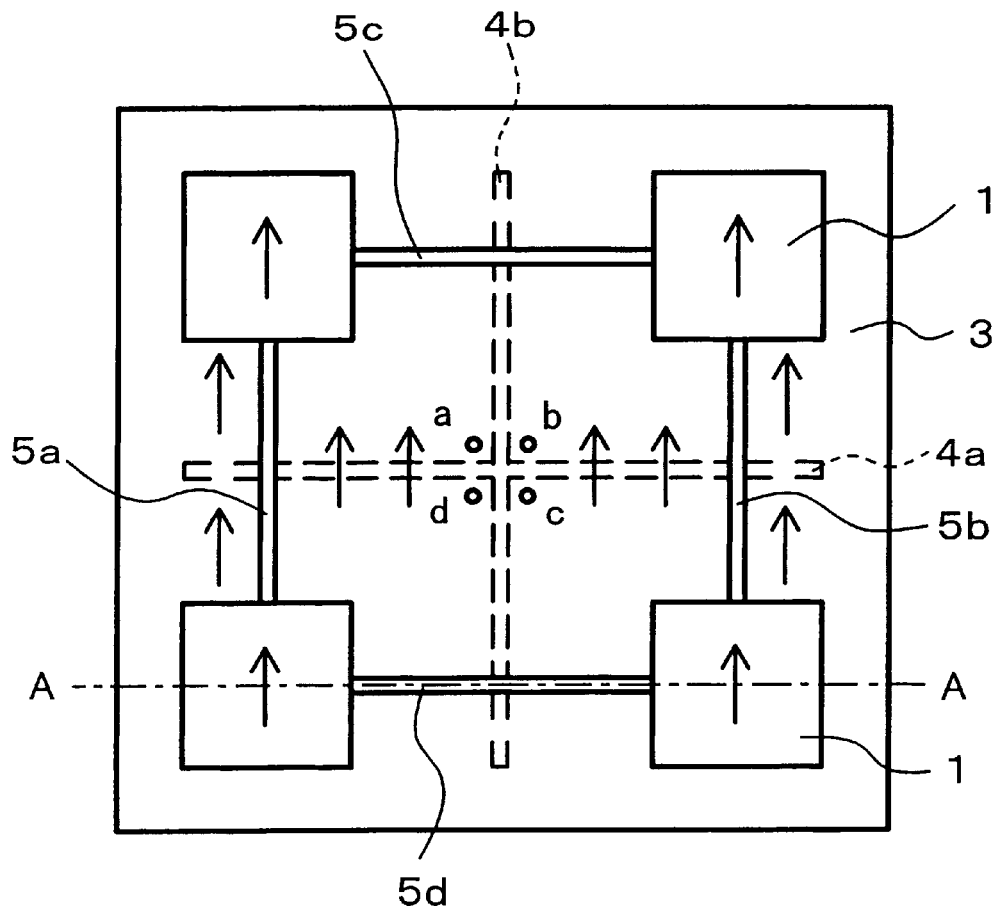
FIG. 2A is a plan view illustrating a multi-element planar array antenna according to a first embodiment of the present invention and its exemplary operation.
Figure 2B:
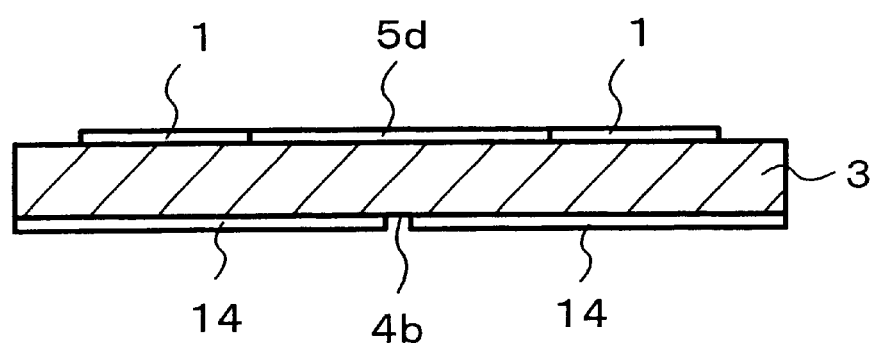
FIG. 2B is a cross-sectional view taken along line A—A in FIG. 2A.

A multi-element planar array antenna according to a first embodiment of the present invention, illustrated in FIGS. 2A and 2B, comprises substrate 3 made, for example, of a dielectric material or the like; ground conductor 14 formed substantially over the entirety of a first principal surface of substrate 3; first and second slot line 4a, 4b formed in ground conductor 14; and four antenna elements 1 of microstrip line type each formed on a second principal surface of substrate 3 as a nearly square circuit conductor. First and second slot lines 4a, 4b, each of which is formed as a slot line having the same length and short-circuited at both ends, extend in directions orthogonal to each other and intersect each other at their midpoints. In the figures, first slot line 4a extends in the horizontal direction, while second slot line 4b extends in the vertical direction.

In other words, slot lines 4a, 4b are formed in a cruciate shape as a whole. As will be later described, the planar antenna is fed at four corners formed at the intersection of slot lines 4a, 4b in ground conductor 14.

On the second principal surface of substrate 3, four microstrip lines 5a to 5d are routed at equal distances from the intersection of slot lines 4a, 4b in the vertical and horizontal directions such that microstrip lines 5a to 5d orthogonally traverse slot lines 4a, 4b. The leading end of each slot line 4a, 4b, which is short-circuited to form a termination, is preferably extended by approximately $\lambda/4$ beyond the position across which associated microstrip line 5a to 5d traverses. Here, $\lambda$ represents a wavelength corresponding to the antenna frequency. In this configuration, the leading end of each slot line 4a, 4b electrically functions as an open end at the antenna frequency, viewed from the intersection with the associated microstrip line.

All microstrip lines 5a to 5d have the same length, and are formed along the sides of a square as a whole. At positions corresponding to the corners of the square, antenna elements 1 are disposed, respectively. Specifically, antenna element 1 at the upper right corner in the figure is connected to the right end of microstrip line 5c and an upper end of microstrip line 5b, and is fed at two points from these microstrip lines 5c, 5b. Similarly, antenna element 1 at the lower right corner in the figure is connected to the right end of microstrip line 5d and the lower end of microstrip line 5b; antenna element 1 at the upper left corner in the figure is connected to the left end of microstrip line 5c and the upper end of microstrip line 5a; and antenna element 1 at the lower left corner in the figure is connected to the left end of microstrip line 5d and the lower end of microstrip line 5a.

In this planar antenna, each antenna element 1 has a degeneration mode in the horizontal and vertical directions orthogonal to each other. The same electronic length is set from the intersection of first and second slot lines 4a, 4b to respective antennas 1 through slot lines 4a, 4b and microstrip lines 5a to 5d.

Next, the operation of the slot lines will be described. As described above, in this planar antenna, a high frequency signal is applied at a feed position generally composed of the four corners in ground conductor 14 which are formed at the position at which first and second slot lines 4a, 4b intersect. For convenience, the four corners are designated a, b, c, d in the clockwise direction from the upper left corner in the figure.

First, among four corners at the feed position, corners a, b above first slot line 4a are designated as a pair, while corners c, d below first slot line 4a are likewise designated as another pair. A high frequency signal is applied between corners a, b and corners c, d. In this event, first slot line 4a is excited by the high frequency signal applied on both sides thereof, permitting a high frequency component in a balanced mode to propagate through first slot line 4a. Then, the high frequency component is converted to an unbalanced mode by first and second microstrip lines 5a, 5b which traverse first slot line 4a on the left and right end sides, respectively. The converted high frequency component propagates to respective antenna elements 1.

In this event, since the transition from the slot line to the microstrip line is made through an anti-phase series branch, the high frequency components converted by microstrip lines 5a, 5b propagate in opposite phase. Since the electric lengths from the intersection of slot lines 4a, 4b to respective antenna elements 1 are identical, respective antenna elements 1 are applied with the high frequency signal in opposite phase. However, respective antenna elements 1 are excited in phase because the feed points of the antenna elements are in a mirror symmetry relationship. Since respective antenna elements 1 are fed in the vertical direction, a vertical polarization is excited.

It should be noted that in the above operation, second slot line 4b is not excited, and no high frequency component propagate through microstrip lines 5c, 5d.

Figure 3:
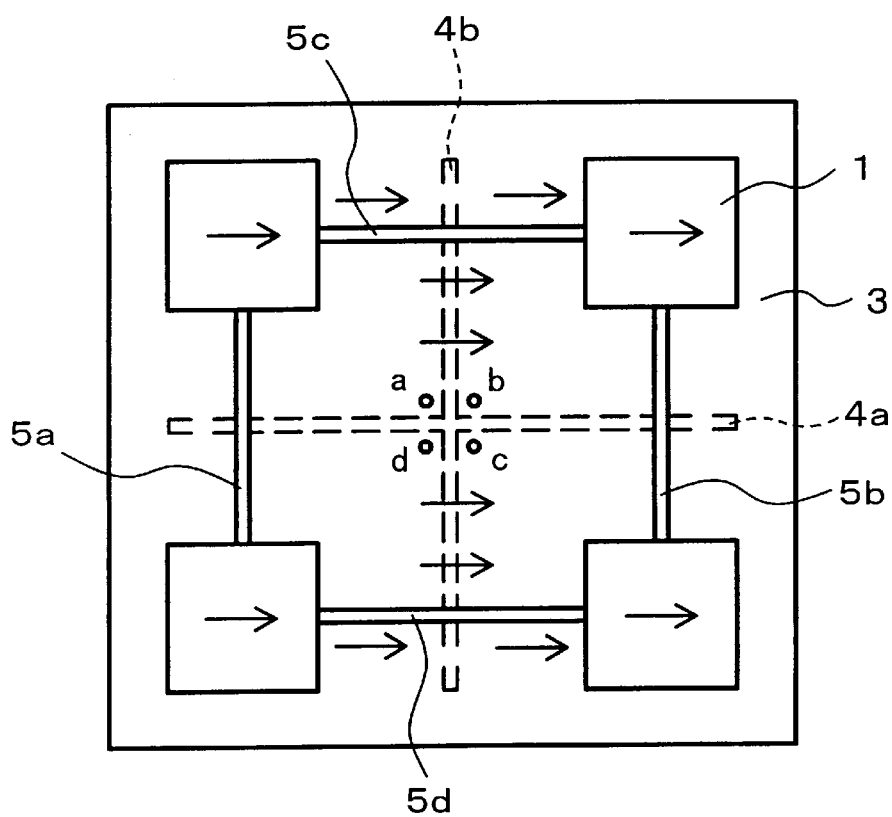
FIG. 3 is a plan view illustrating another exemplary operation of the antenna according to the first embodiment.

Next, as illustrated in FIG. 3, among four corners a, b, c, d, corners a, d positioned on the left side of second slot 4b are designated as one pair, while corners b, c positioned on the right side of second slot line 4b are likewise designated as another pair. A high frequency signal is applied between corners a, d and corners b, c. In this event, second slot line 4b is excited by the high frequency signal applied on both sides thereof, permitting a high frequency component in a balanced mode to propagate through second slot line 4b. The high frequency component is converted to an unbalanced mode by microstrip lines 5c, 5d which traverse second slot line 4b on the upper and lower end sides, respectively. The converted high frequency component propagate to respective antenna elements 1.

Since the transition from the slot line to the microstrip line is made through an anti-phase series branch, as is the case with the foregoing, the high frequency components converted by microstrip lines 5c, 5d propagate in opposite phase, so that respective antenna elements 1 are applied with the high frequency signal in opposite phase. Since the feed points of the antenna elements are in a mirror symmetry relationship, respective antenna elements 1 are excited in phase. Since respective antenna elements 1 are fed in the horizontal direction, a horizontal polarization is excited.

In this event, first slot line 4a is not excited, so that no high frequency component propagates through microstrip lines 5a, 5b.

Figure 4:
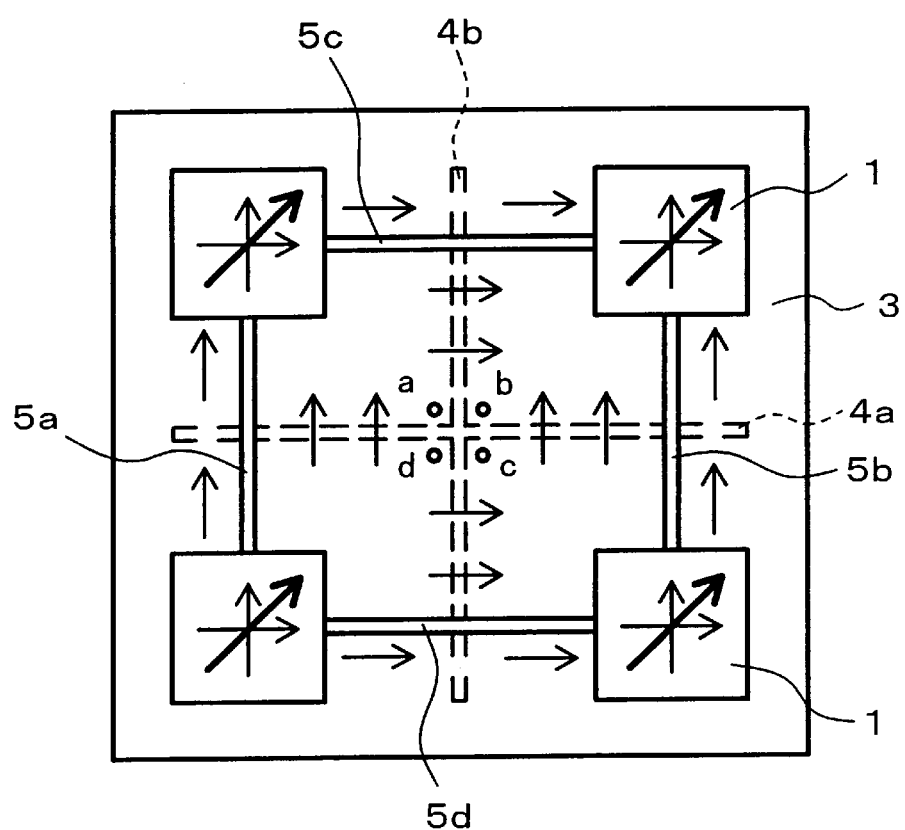
FIG. 4 is a plan view illustrating a further exemplary operation of the antenna according to the first embodiment.
Figure 5:
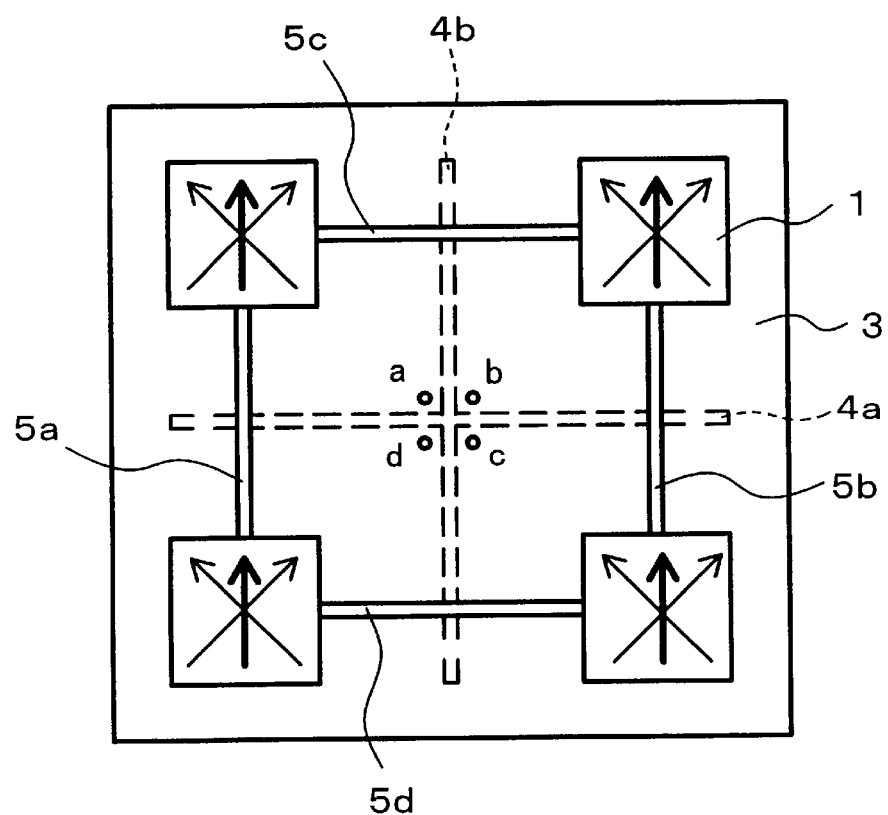
FIG. 5 is a plan view illustrating a further exemplary operation of the antenna according to the first embodiment.

Further, as illustrated in FIG. 4, among four corners a, b, c, d, a high frequency signal is applied between corners d, b on one diagonal. In this event, since corners d, b remain electrically shut off to each other, an electric field is produced between corners b, c and corners c, d, while an electric field is also produced between corners b, a and corners a, d, thereby exciting in-phase high frequency signals having the same amplitude on first and second slot lines 4a, 4b. The high frequency signal excited on first slot line 4a propagates through first slot line 4a, and is branched in opposite phase and in series into microstrip lines 5a, 5b which traverse first slot line 4a on the left and right end sides, respectively. As a result, respective antenna elements 1 are fed in the vertical direction. Similarly, the high frequency signal excited on second slot line 4b propagates through second slot line 4b, and is branched in opposite phase and in series into microstrip lines 5a, 5b which traverse second slot line 4b on the upper and lower end sides, respectively. As a result, respective antenna elements 1 are fed in the horizontal direction. Consequently, each antenna element 1 is fed with the high frequency signals in both the vertical and horizontal directions which are combined to form a linear polarization tilted by 45 degrees to the right, as indicated by a bold arrow.

When the high frequency signal is applied between corners a, c in the diagonal direction opposite to the foregoing, instead of corners b, d, a linear polarization tilted by 45 degrees to the left is formed on a similar principle to the foregoing.

More further, when the high frequency signal is supplied between corners b, d in one diagonal direction out of four corners a, b, c, d at the intersection of slot lines 4a, 4b with an additional high frequency signal being applied between corners a, c in the other diagonal direction, the planar antenna operates as follows: Each antenna element 1 generates a linear polarization tilted by 45 degrees to the right in a similar manner to the foregoing by the high frequency signal applied between corners b, d, and a linear polarization tilted by 45 degrees to the left by the high frequency signal applied between corners a, c. Here, if the high frequency signal applied between corners a, c is identical in level and phase to the high frequency signal applied between corners b, d, the linear polarization tilted by 45 degrees to the right is combined with the linear polarization tilted by 45 degrees to the left to form a polarization substantially in the vertical direction, i.e., a vertical polarization. Thus, the linear polarization can be arbitrarily controlled in terms of the polarization direction by applying the high frequency signals at different levels to each other.

While the multi-element planar array antenna according to the first embodiment has been described with particular emphasis on the operation during transmission, the antenna operates in a manner similar to the foregoing during reception as well, as should be understood in consideration of the reversibility between the transmission operation and reception operation in antennas. Also, while antenna element 1 is in the shape of a square, it can be in any shape as long as the degeneration mode can exist in the orthogonal directions. For example, the antenna element 1 can be formed of a circular circuit conductor.

Next, a multi-element planar array antenna according to a second embodiment of the present invention will be described with reference to FIG. 6. This planar antenna is similar to the planar antenna according to the first embodiment except that the former is designed for use with a circular polarization.

Figure 6:
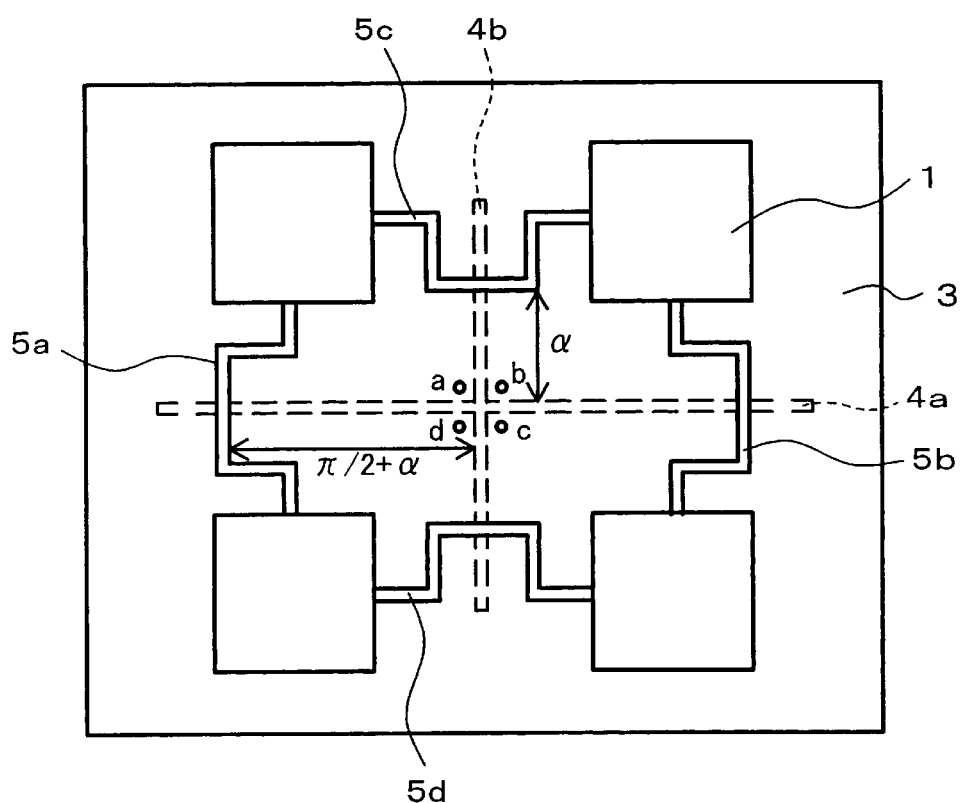
FIG. 6 is a plan view illustrating a multi-element planar array antenna according to a second embodiment of the present invention.

The planar antenna illustrated in FIG. 6 largely differs from the planar antenna illustrated in FIGS. 2A and 2B in that the electric length of first slot line 4a from the position at which slot lines 4a, 4b intersect to the points at which microstrip lines 5a, 5b traverse first slot line 4a is different from the electric length of second slot line 4b from the position at which slot lines 4a, 4b intersect to the points at which microstrip lines 5c, 5d traverse second slot line 4b by π/2 as calculated in terms of phase difference. In this example, each antenna element 1 is geometrically disposed at a corner of the square, and first slot line 4a extending in the horizontal direction is made longer than second slot line 4b extending in the vertical direction. In addition, microstrip lines 5a, 5b extending in the vertical direction are bent in the shape of a crank to the outside, while microstrip lines 5c, 5d extending in the horizontal direction are bent in the shape of a crank to the inside. Microstrip lines 5a to 5d are connected to associate antenna elements 1.

In the configuration as described above, a vertically excited high frequency signal is delayed by π/2 in phase from a horizontally excited high frequency signal. Therefore, when the high frequency signal is applied between corners b, d, electromagnetic radiations propagating in front on the drawing sheet will exhibit a right-handed circular polarization. Similarly, the high frequency signal applied between corners a, c will result in a left-handed circular polarization. In addition, as the high frequency signal is applied between corners b, d with additional high frequency signal applied between corners a, c, a right-handed circular polarization and a left handed circular polarization are simultaneously excited. In this manner, the right-handed circular polarization or left-handed circular polarization can be selected depending on which diagonal direction is selected at the intersection of slot lines 4a, 4b for applying the high frequency signal. Moreover, the right-handed circular polarization and left-handed circular polarization can be used together by applying the high frequency signal in both the diagonal directions. Consequently, the second embodiment can readily implement a multi-element planar array antenna which can select one from orthogonal circular polarizations and can use these circular polarizations together.

In the example shown herein, a difference corresponding to a phase difference of π/2 is provided between the electric lengths of first and second slot lines 4a, 4b from the intersection of slot lines 4a, 4b, in which case the basic operation still remains unchanged when second slot line 4b extending in the vertical direction is made longer in the electric length from the intersection by π/2 than first slot line 4a extending in the horizontal direction. Alternatively, slot lines 4a, 4b may be equal in the electric length, whereas a difference corresponding to a phase difference of π/2 may be provided between microstrip lines 5a, 5b and microstrip line 5c, 5d. Moreover, this difference in the electric length may be appropriately distributed between the slot lines and microstrip lines as long as the difference between the electric lengths from the position at which slot lines 4a, 4b intersect to two feed points of each antenna element 1 is π/2 as calculated in terms of phase difference.

Figure 7:
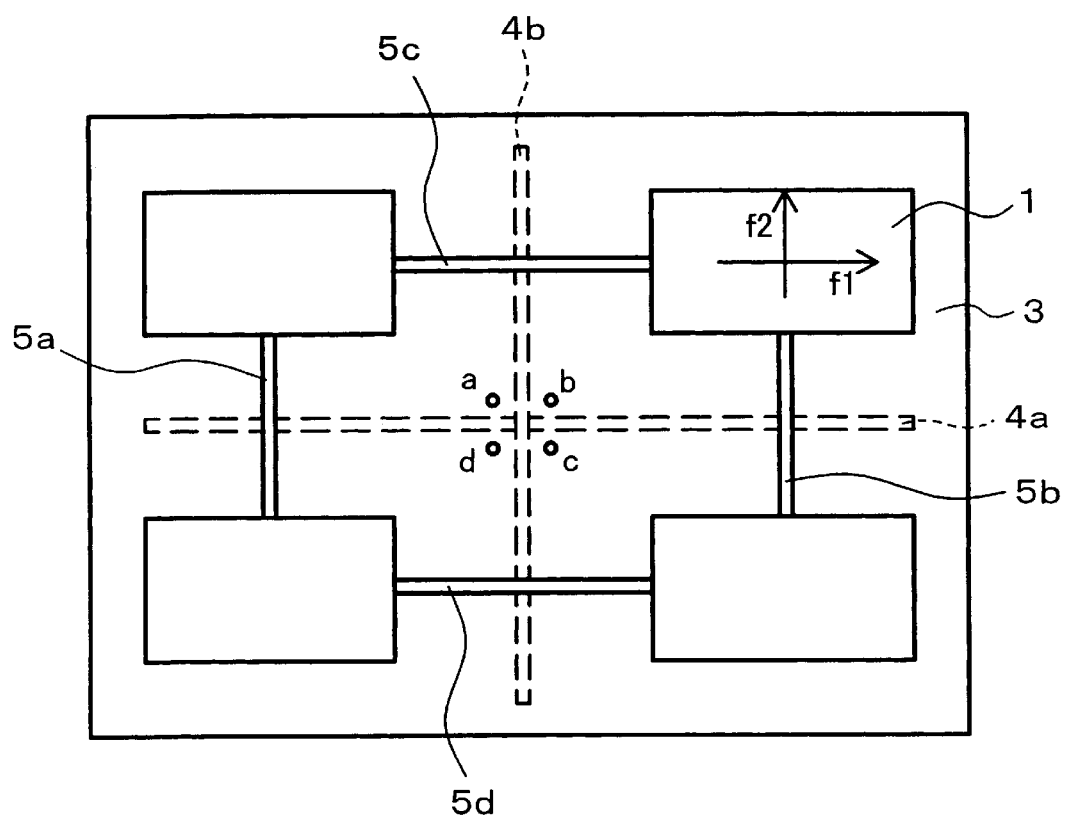
FIG. 7 is a plan view illustrating a multi-element planar array antenna according to a third embodiment of the present invention.

Next, a multi-element planar array antenna according to a third embodiment of the present invention will be described with reference to FIG. 7. The planar antennas in the respective embodiments described above are each configured to select a polarization component and use together different polarization components at the same operating frequency of the antenna, whereas the planar antenna illustrated in FIG. 7 is configured to use together different operating frequencies. The planar antenna illustrated in FIG. 7 is similar to the one illustrated in FIGS. 2A and 2B except that a rectangular circuit conductor is used for antenna element 1. Specifically, an antenna frequency $f_1$ in a horizontal polarization resulting from the horizontal dimension of antenna element is different from an antenna frequency $f_2$ in a vertical polarization resulting from the vertical dimension. For convenience, suppose herein that antenna frequency $f_2$ is higher than antenna frequency $f_1(f_2>f_1)$ on the assumption that antenna element 1 is longer from side to side, as illustrated.

In the configuration as described above, as a high frequency signal is applied between corners a, b and corners c, d, for example, at the position at which first and second slot lines 4a, 4b intersect, first slot line 4a extending in the horizontal direction is excited. Then, each antenna element 1 is applied with the high frequency signal in the vertical direction through microstrip lines 5a, 5b. Thus, the planar antenna can be operated at antenna frequency $f_2$ with the vertical polarization. Similarly, as a high frequency signal is applied between corners a, d and corners b, c, second slot line 4b extending in the vertical direction is excited, so that each antenna element 1 is applied with the high frequency signal in the horizontal direction through microstrip lines 5c, 5d. Thus, the planar antenna can be operated at antenna frequency $f_1$ with the horizontal polarization. From the foregoing, the resulting multi-element planar array antenna can be operated at two frequencies selected through the orthogonal linear polarizations.

Preferably, in the planar antenna according to the third embodiment, both ends of first slot line 4a extend beyond the positions at which microstrip lines 5a, 5b traverse first slot line 4a by one-quarter wavelength with respect to antenna frequency $f_2$. Likewise, both ends of second slot line 4b preferably extend beyond the positions at which microstrip lines 5c, 5d traverse second slot line 4b by one-quarter wavelength with respect to antenna frequency $f_1$.

Next, a multi-element planar array antenna according to a fourth embodiment of the present invention will be described with reference to FIGS. 8A and 8B. Particularly shown herein is a specific method of feeding the multi-element planar array antenna of the first embodiment.

Figure 8A:
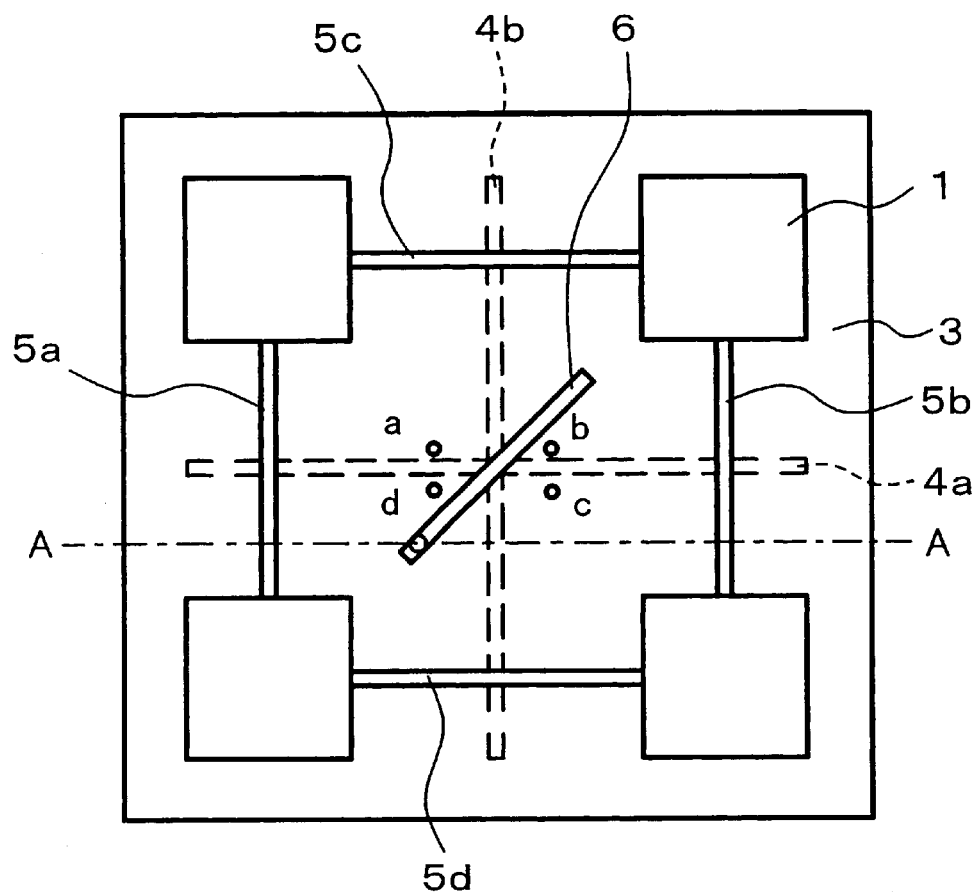
FIG. 8A is a plan view illustrating a multi-element planar array antenna according to a fourth embodiment of the present invention.
Figure 8B:
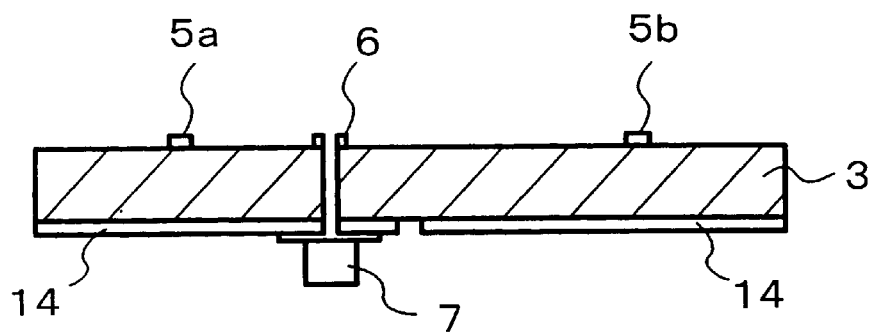
FIG. 8B is a cross-sectional view taken along line A—A in FIG. 8A.

FIGS. 8A and 8B illustrate an example in which the planar antenna is fed between corners b, d positioned in one diagonal direction at the position at which first and second slot lines 4a, 4b intersect. In this example, a feed microstrip line 6 is provided on the second principal surface of substrate 3 and is electromagnetically coupled to corners b, d. A high frequency signal is applied between corners b, d through feed microstrip line 6. Microstrip line 6 passes immediately above the position at which first and second slot lines 4a, 4b intersect. The length from the intersection to an open end of microstrip line 6 is set to approximately one-quarter wavelength with respect to a designed center frequency of the planar antenna. The other end of microstrip line 6 is connected to feed connector 7 disposed on the first principal surface of substrate 3 through a via hole. For example, a coaxial cable, not shown, is connected to feed connector 7.

In the configuration as described above, the planar antenna according to the fourth embodiment can readily transmit the aforementioned linear polarization tilted by 45 degrees to the right by applying a high frequency signal from the coaxial cable between corners b, d in one diagonal direction at the intersection of slot lines 4a, 4b through feed microstrip line 6. Likewise, the planar antenna can readily receive the linear polarization tilted by 45 degrees to the right in the same configuration. In addition, a similar feed microstrip line may be used for applying a high frequency signal between corners a, c, between corners a, b and corners c, d, and between corners a, d and corners b, c. In these events, the planar antenna can use a linear polarization tilted by 45 degrees to the left together with the linear polarization tilted by 45 degrees to the right when feed microstrip lines are formed not only in one diagonal direction, i.e., in the direction of corners b, d but also in the other diagonal direction, i.e., in the direction of corners a, c.

As described above, the multi-element planar array antenna based on the present invention can be fed by simply disposing feed microstrip line 6. This feature can be applied not only to the planar antenna according to the first embodiment for use with a linear polarization but also to the planar antenna according to the second embodiment for use with a circular polarization.

Figure 9A:
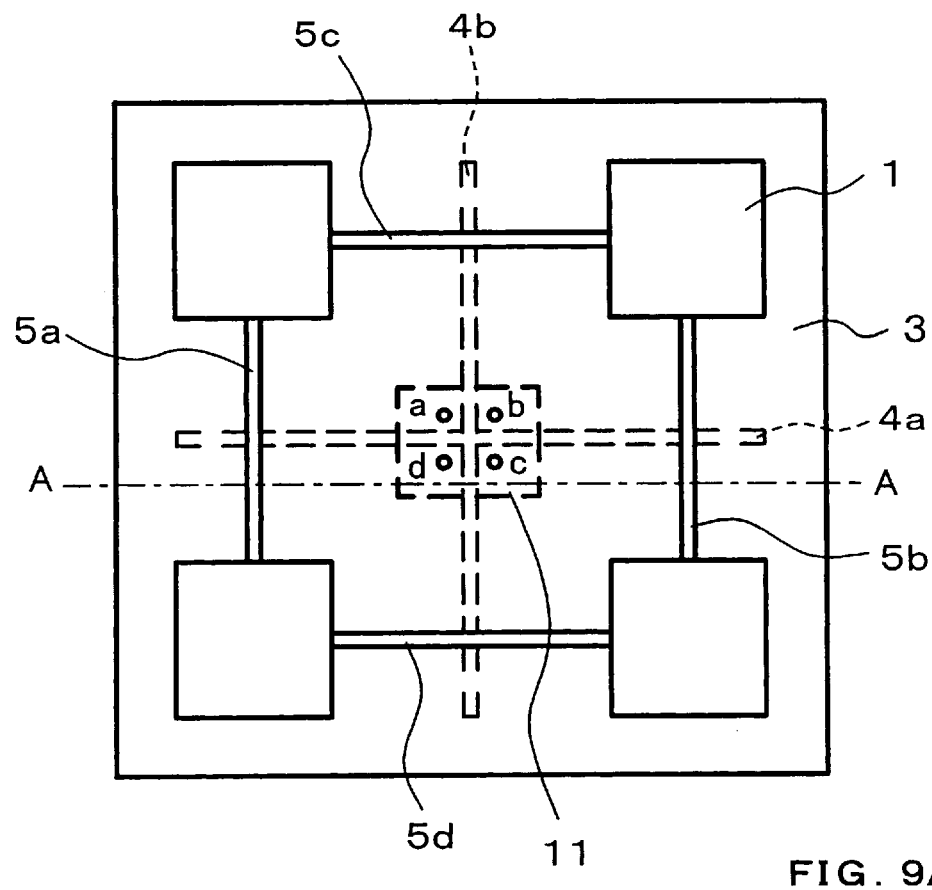
FIG. 9A is a plan view illustrating a multi-element planar array antenna according to a fifth embodiment of the present invention.
Figure 9B:
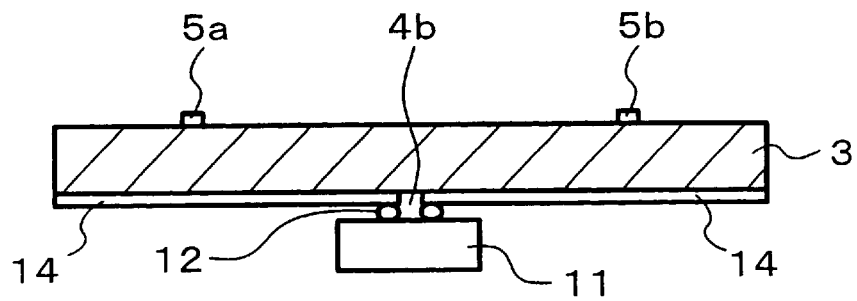
FIG. 9B is a cross-sectional view taken along line A—A in FIG. 9A.

Next, a multi-element planar array antenna according to a fifth embodiment of the present invention will be described with reference to FIGS. 9A and 9B. In this planar antenna, functional circuit 11, for example, a semiconductor device, an integrated circuit or the like is mounted by surface mounting, flip chip bump technique or the like, at the intersection of slot lines 4a, 4b on the first principal surface of substrate 3 in the planar antenna of the first embodiment. Functional circuit 11 permits a high frequency signal to be selectively applied to corners a, b, c, d at the intersection of the slot lines through functional circuit 11. In the illustrated configuration, functional circuit 11 is connected to the respective corners through bumps 12.

In the configuration as described above, functional circuit 11 may be controlled to facilitate a selection of applying a high frequency signal between corners b, d; between corners a, c; between corners a, b and corners c, d; and between corners a, d and corners b, c, thereby enabling the planar antenna to transmit and receive a polarization tilted by 45 degrees to the right, a polarization tilted by 45 degree to the left, a horizontal polarization, and a vertical polarization. From the foregoing, the planar antenna according to the fifth embodiment can readily select one from the linear polarizations listed above, and use such linear polarizations together. Generally, a millimeter-wave communication system suffers from a large loss on feed lines in addition to small power produced from an oscillation element. Such a problem on the loss can be solved by incorporating an active device such as an amplifier, a frequency converter and the like in the multi-element planar array antenna as functional circuit 11. Further functions can be added to the multi-element planar array antenna to implement an active antenna or an adaptive array antenna. In addition, the configuration provided by the fifth embodiment is suitable for a smart antenna for controlling a main beam and suppressing interfering waves because of its ability to appropriately control and select a polarization.

Figure 10A:
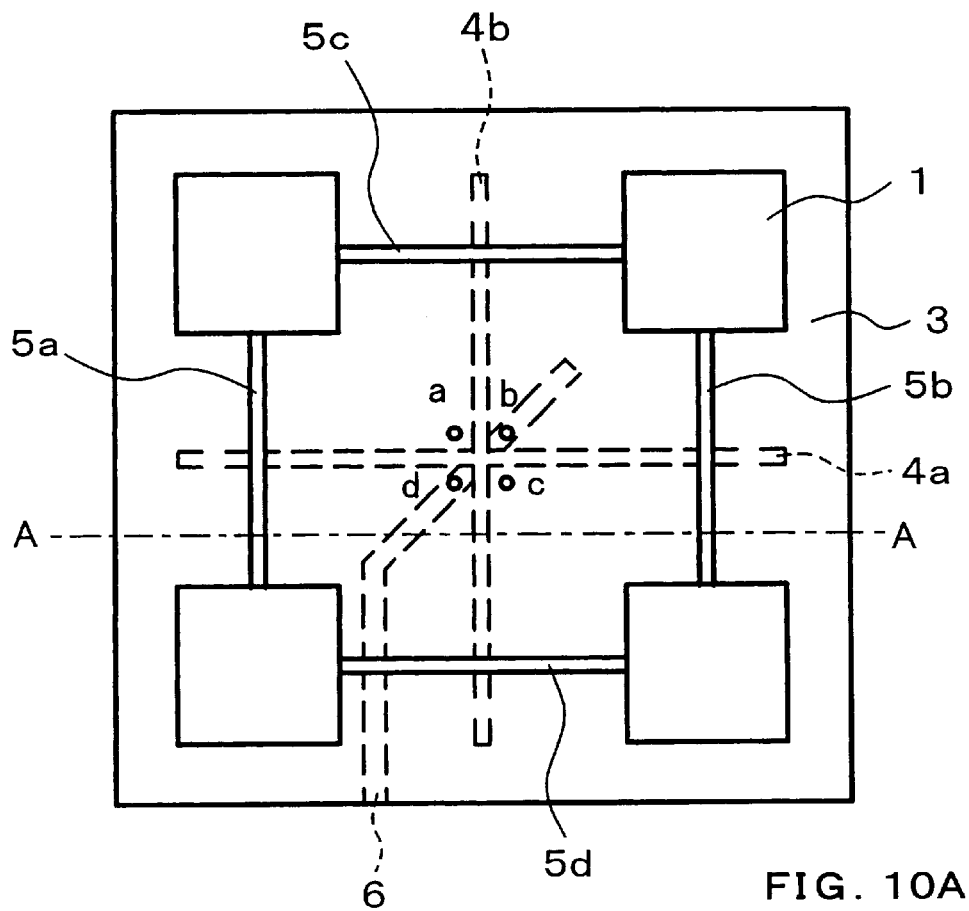
FIG. 10A is a plan view illustrating a multi-element planar array antenna according to a sixth embodiment of the present invention.
Figure 10B:
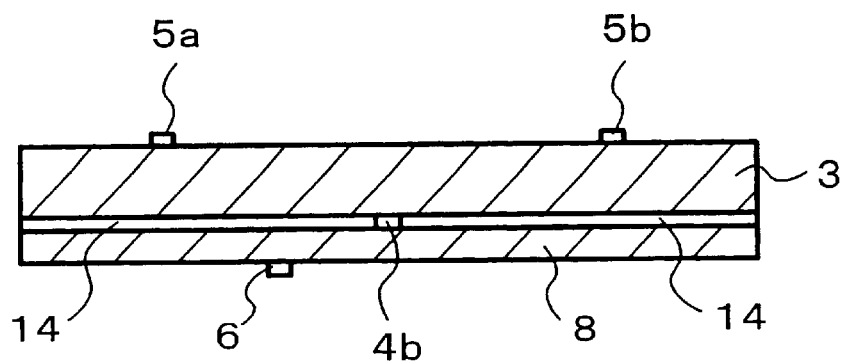
FIG. 10B is a cross-sectional view taken along line A—A in FIG. 10A.

Next, a multi-element planar array antenna according to a sixth embodiment of the present invention will be described with reference to FIGS. 10A and 10B.

This embodiment is similar to the fifth embodiment in that it shows a structure for feeding the multi-element planar array antenna. However, while the fifth embodiment has shown single layer substrate 3 which is used for feeding, the planar antenna according to the sixth embodiment comprises a feeder circuit in a multi-layered substrate without via holes.

Specifically, in the planar antenna according to the sixth embodiment, second substrate 8 made of a dielectric material or the like is laminated on substrate 3 with one principal surface of second substrate 8 opposing the first principal surface of substrate 3 in the planar antenna according to the first embodiment. In addition, feed microstrip line 6 is provided on the other principal surface of second substrate 8. Feed microstrip line 6 is electromagnetically coupled to corners b, d at the intersection of slot lines 4a, 4b through second substrate 8. The other end of microstrip line 6 is led to an end of second substrate 8 at which a coaxial cable, not shown, or the like is connected.

In the configuration as described above, a high frequency signal is applied between corners b, d in one diagonal direction at the intersection of slot lines 4a, 4b through feed microstrip line 6 provided on the one principal surface of the multi-layered substrate, i.e., the other principal surface of second substrate 8, enabling the planar antenna to transmit and receive the aforementioned linear polarization tilted by 45 degrees to the right. In addition, since no via hole is needed, a circuit loss can be limited. As will be appreciated, other arrangements of feed microstrip line 6 enable the planar antenna of the sixth embodiment to transmit and receive a linear polarization tilted by 45 degrees to the left, a horizontal polarization, and a vertical polarization as well as to use together circular polarizations and linear polarizations.

Further, in the sixth embodiment, the aforementioned functional circuit such as a semiconductor device and IC may be mounted on the other principal surface of second substrate 8, or a circuit board comprising a transmission line electromagnetically coupled to feed microstrip line 6 and a functional circuit may be mounted on second substrate 8 to implement an active antenna or a smart antenna.

Figure 11A:
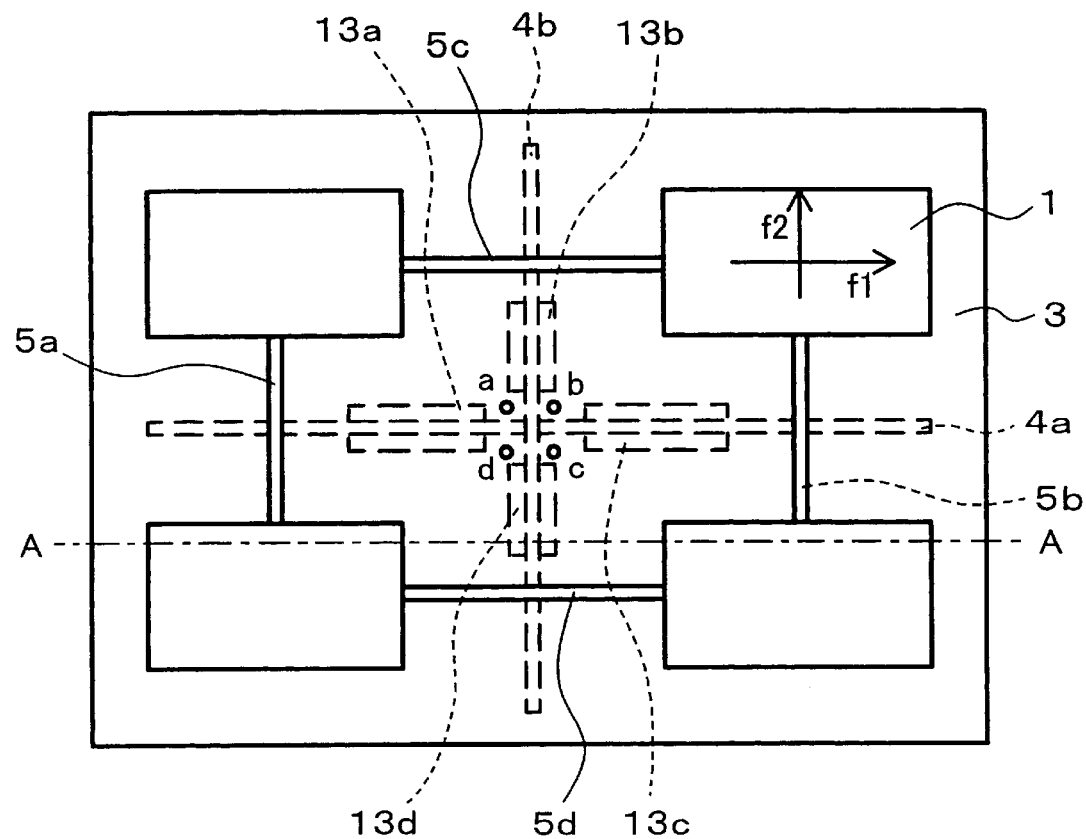
FIG. 11A is a plan view illustrating a multi-element planar array antenna according to a seventh embodiment of the present invention.
Figure 11B:
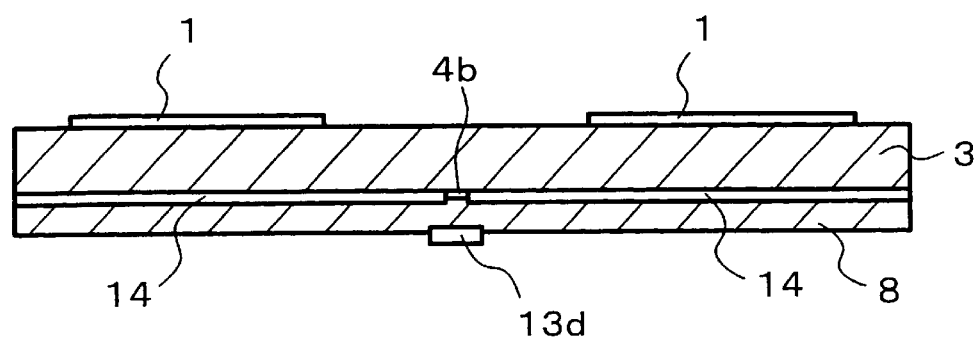
FIG. 11B is a cross-sectional view taken along line A—A in FIG. 11A.

Next, a multi-element planar array antenna according to a seventh embodiment of the present invention will be described with reference to FIGS. 11A and 11B.

In this planar antenna, second substrate 8 made of a dielectric material or the like is laminated on substrate 3 with one principal surface of second substrate 8 opposing the first principal surface of substrate 3, on which slot lines 4a, 4b are formed, in the planar antenna illustrated in FIG. 7. Feed microstrip lines 13a to 13d are formed on the other principal surface of second substrate 8 such that they overlap first and second slot lines 4a, 4b within the region from the intersection of slot lines 4a, 4b to positions at which microstrip lines 5a to 5d traverse these slot lines 4a, 4b. Feed microstrip lines 13a to 13d have a width larger than that of slot lines 4a, 4b.

In the configuration as described above, as a high frequency signal is applied, for example, to feed microstrip lines 13a, 13c extending in the horizontal direction, an electric field is produced between corners a, d and corners b, c at the intersection of slot lines 4a, 4b by electromagnetic coupling from microstrip lines 13a, 13c, thereby exciting second slot line 4b extending in the vertical direction as illustrated. Consequently, each antenna element 1 is fed in the horizontal direction through microstrip lines 5c, 5d. Similarly, as a high frequency signal is applied to feed microstrip lines 13b, 13d extending in the vertical direction, first slot line 4a extending in the horizontal direction is excited, so that each antenna element 1 is fed in the vertical direction through microstrip lines 5a, 5b.

While the seventh embodiment has illustrated a planar antenna which has rectangular antenna elements 1 and operates at two-antenna frequencies $f_1$, $f_2$, the seventh embodiment can be applied as well to a planar antenna which has square antenna elements 1. Similar to the aforementioned sixth embodiment, the functional circuit such as a semiconductor device and IC may be mounted on the other principal surface of second substrate 8, or a circuit board comprising a transmission line electromagnetically coupled to microstrip lines 13a to 13d and a functional circuit may be laminated on second substrate 8 to readily implement an active antenna or a smart antenna.

Next, a multi-element planar array antenna according to an eighth embodiment of the present invention will be described with reference to FIG. 12. The number of antenna elements in the multi-element planar array antenna of the present invention is not limited to four, but any number of antenna elements such as 8, 16, 64 and the like may be provided. Therefore, described herein is a 16-element planar array antenna for use with a linear polarization based on the present invention.

Figure 12:
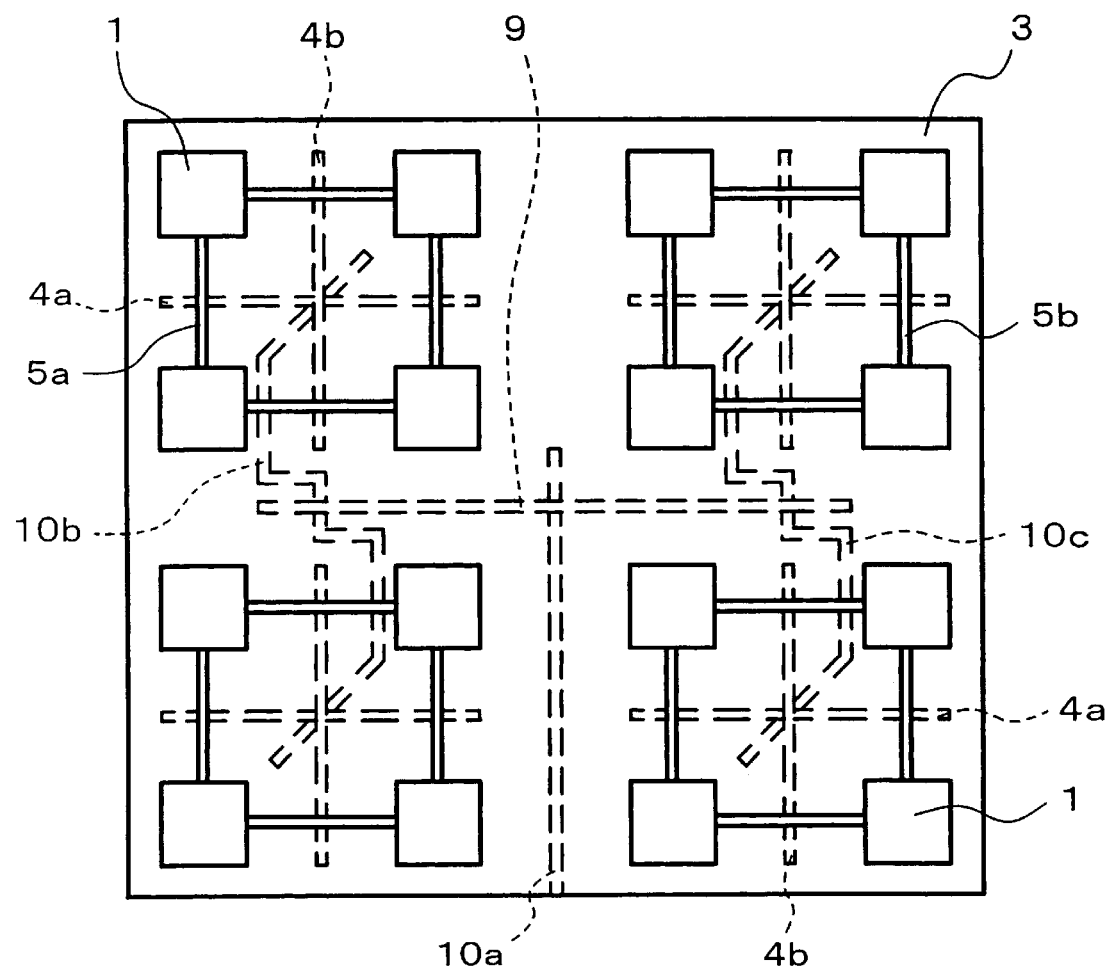
FIG. 12 is a plan view illustrating a multi-element planar array antenna according to an eighth embodiment of the present invention.

The planar antenna illustrated in FIG. 12 comprises four sets of the planar array antenna structures described in the first embodiment which are arranged on the same substrate 3 in 2×2 matrix configuration.

A specific feeding method in the eighth embodiment may be, for example, as follows: Feed slot line 9 extending in the horizontal direction is disposed on a first principal surface of substrate 3 between upper and lower four-element planar array antennas disposed as illustrated. Second substrate 8 is laminated on the first principal surface of substrate 3 as mentioned above, and feed microstrip lines 10a to 10c are formed on the other principal surface of second substrate 8. Microstrip line 10a traverses feed slot line 9 and is electromagnetically coupled thereto. Microstrip lines 10b, 10c have their central portions electromagnetically coupled to slot line 9 on both end sides of slot line 9. Microstrip lines 10b, 10c have their both end sides electromagnetically coupled to the intersection of the slot lines in the upper and lower four-element planar array antennas, arranged side by side, for feeding between corners b, c, in a manner similar to microstrip line 6 (see FIGS. 10A and 10B) in the planar antenna of the sixth embodiment.

In the configuration as described above, a high frequency signal applied from microstrip line 10a is branched at the center of feed slot line 9 in parallel and in phase for distribution. Then, the high frequency signal is branched in opposite phase and in series on both end sides of slot line 9, and distributed to microstrip lines 10b, 10c, respectively. Thus, the high frequency signal is applied in phase between corners b, c at the intersection of the slot lines in each of the four units of four-element planar array antennas. In this manner, a total of 16 antenna elements in the units transmit and receive a linear polarization tilted by 45 degrees to the right. The resulting 16-element planar array antenna provides a higher sensitivity. The 16-element planar array antenna as described above is not limited to the use with a linear polarization, but can be configured for use with a circular polarization by combining, for example, four units of the planar antennas of the second embodiment.

What is claimed is:

1. A multi-element planar array antenna comprising:
    a substrate;
    a ground conductor formed on a first principal surface of said substrate;
    a first and a second slot line formed in said ground conductor, and intersecting each other;
    a first and a second microstrip line formed on a second principal surface of said substrate, and traversing said first slot line respectively at positions corresponding to both end sides of said first slot line;
    a third and a fourth microstrip line formed on the second principal surface, and traversing said second slot line respectively at positions corresponding to both end sides of said second slot line;
    a first antenna element formed on said second principal surface and connected to one end of said first microstrip line and to one end of said third microstrip line;
    a second antenna element formed on said second principal surface and connected to one end of said second microstrip line and to the other end of said third microstrip line;
    a third antenna element formed on said second principal surface and connected to the other end of said second microstrip line and to one end of said fourth microstrip line; and
    a fourth antenna element formed on said second principal surface and connected to the other end of said first microstrip line and to the other end of said fourth microstrip line,
    wherein each said antenna element is a microstrip line antenna element capable of being excited in two directions.

2. The antenna according to claim 1, wherein said antenna includes a feed position at an intersection of said first and second slot lines, through which a high frequency signal is applied between at least two selected from four corners formed in said ground conductor at said intersection to select an excitation mode for each said antenna element.

3. The antenna according to claim 2, wherein said first and second slot lines extend in directions orthogonal to each other, and said first slot line matches with said second slot line at their respective midpoints to define said intersection.

4. The antenna according to claim 2, wherein each said antenna element has two feed points at which two of said microstrip lines are connected to said antenna element, respectively, and electric lengths are all equal from said intersection to said respective feed points through said respective slot lines and said microstrip lines.

5. The antenna according to claim 4, wherein said first and second slot lines are equal in length.

6. The antenna according to claim 4, wherein a high frequency signal is applied between both sides of one of said first and second slot lines by pairing said corners positioned on each side of said one slot line at said intersection.

7. The antenna according to claim 4, wherein a high frequency signal is applied between a pair of corners positioned in one diagonal direction out of said four corners at said intersection.

8. The antenna according to claim 4, wherein a first high frequency signal is applied between a pair of corners positioned in a first diagonal direction, and a second high frequency signal is applied between a pair of corners positioned in a second diagonal direction different from said first diagonal direction at said intersection.

9. The antenna according to claim 4, wherein each said antenna element is in a shape of a square.

10. The antenna according to claim 2, wherein each said antenna element has two feed points at which two of said microstrip lines are respectively connected to said antenna element, and an electric length from said intersection to one feed point through said first slot line differs from an electric length from said intersection to the other feed point through said second slot line by $\pi/2$ as calculated in terms of phase.

11. The antenna according to claim 10, wherein a high frequency signal is applied between a pair of corners positioned in one diagonal direction out of said four corners at said intersection.

12. The antenna according to claim 10, wherein a first high frequency signal is applied between a pair of corners positioned in a first diagonal direction, and a second high frequency signal is applied between a pair of corners positioned in a second diagonal direction different from said first diagonal direction at said intersection.

13. The antenna according to claim 2, wherein each said antenna element is in a shape of a rectangle, and a high frequency signal is applied between a pair of corners positioned in one diagonal direction out of said four corners at said intersection.

14. The antenna according to claim 2, wherein each said antenna element is in a shape of a rectangle, and a high frequency signal is selectively applied between a first pair of corners positioned in a first diagonal direction or between a second pair of corners positioned in a second diagonal direction different from said first diagonal direction out of said four corners at said intersection.

15. The antenna according to claim 2, further comprising a feed microstrip line disposed on said second principal surface and traversing said intersection.

16. The antenna according to claim 2, further comprising a functional circuit disposed on said first principal surface and connected to said intersection for controlling a feed to said each corner.

17. The antenna according to claim 2, further comprising:
    a second substrate bonded on said second principal surface, said second substrate having one principal surface opposing said second principal surface; and
    a feed microstrip line routed on the other principal surface of said second substrate, and traversing said intersection such that said feed microstrip line is electromagnetically coupled to a pair of corners at said intersection.

18. The antenna according to claim 2, further comprising:

a second substrate bonded on said second principal surface, said second substrate having one principal surface opposing said second principal surface; and a first to a fourth feed microstrip line formed on the other principal surface of said second substrate such that said feed microstrip lines overlap said first and second slot lines across said intersection.

19. A multi-element planar array antenna comprising:

a substrate; and two or more planar antenna units formed on said substrate, wherein said each planar antenna unit comprises: a ground conductor formed on a first principal surface of said substrate; a first and a second slot line formed in said ground conductor, and intersecting each other; a first and a second microstrip line formed on a second principal surface of said substrate, and traversing said first slot line respectively at positions corresponding to both end sides of said first slot line; a third and a fourth microstrip line formed on the second principal surface, and traversing said second slot line respectively at positions corresponding to both end sides of said second slot line; and four antenna elements of microstrip line type formed respectively in intersection regions between both end sides of said first and second microstrip lines and both end sides of said third and fourth microstrip lines, respectively, on the second principal surface of said substrate, each antenna element being capable of being excited in two directions, a feed position being defined at the intersection of said first and second slot lines, said antenna further comprises: a second substrate bonded on said second principal surface, said second substrate having one principal surface opposing said second principal surface; and a feed microstrip line routed on the other principal surface of said second substrate, and traversing said intersection such that said feed microstrip line is electromagnetically coupled to a pair of corners at said intersection, and said each antenna element on said each planar antenna unit is excited in phase.

* * * * *

UNITED STATES PATENT AND TRADEMARK OFFICE
CERTIFICATE OF CORRECTION

PATENT NO. : 6,753,817 B2
DATED : June 22, 2004
INVENTOR(S) : Aikawa et al.

It is certified that error appears in the above-identified patent and that said Letters Patent is hereby corrected as shown below:

<u>Title page,</u>
After "[22] Filed: Dec. 23, 2002" should read:
-- [30] Foreign Application Priority Data
 Dec. 27, 2001 (JP) ..........................2001-397481 --

Signed and Sealed this

Seventeenth Day of August, 2004

JON W. DUDAS
*Acting Director of the United States Patent and Trademark Office*

UNITED STATES PATENT AND TRADEMARK OFFICE
CERTIFICATE OF CORRECTION

| | |
|---|---|
| PATENT NO. | : 6,753,817 B1 |
| APPLICATION NO. | : 10/328289 |
| DATED | : June 22, 2004 |
| INVENTOR(S) | : Masayoshi Aikawa et al. |

It is certified that error appears in the above-identified patent and that said Letters Patent is hereby corrected as shown below:

The following is added on the front page of the patent in the left column:

--(73)   Assignee:
Nihon Dempa Kogyo Co., Ltd., Tokyo (JP), Masayoshi Aikawa, Yokohama, (JP)--

Signed and Sealed this

Seventh Day of December, 2010

David J. Kappos
*Director of the United States Patent and Trademark Office*